United States Patent [19]

Hamdy et al.

[11] Patent Number: 4,899,205

[45] Date of Patent: * Feb. 6, 1990

[54] ELECTRICALLY-PROGRAMMABLE LOW-IMPEDANCE ANTI-FUSE ELEMENT

[75] Inventors: Esmat Z. Hamdy, Fremont; Amr M. Mohsen; John L. McCullum, both of Saratoga, all of Calif.

[73] Assignee: Actel Corporation, Sunnyvale, Calif.

[*] Notice: The portion of the term of this patent subsequent to Apr. 18, 2006 has been disclaimed.

[21] Appl. No.: 137,935

[22] Filed: Dec. 28, 1987

Related U.S. Application Data

[63] Continuation-in-part of Ser. No. 861,519, May 9, 1986, Pat. No. 4,823,181.

[51] Int. Cl.[4] .................. H01L 27/02; H01L 29/86
[52] U.S. Cl. .................................. 357/51; 357/59; 357/23.6; 357/54
[58] Field of Search ................. 357/23.6, 59, 54, 51

[56] References Cited

U.S. PATENT DOCUMENTS

| | | | |
|---|---|---|---|
| 2,784,389 | 3/1957 | Kelly | 357/51 |
| 3,423,646 | 1/1969 | Cubert et al. | 357/45 |
| 3,576,549 | 4/1981 | Hess et al. | 357/41 |
| 3,634,929 | 1/1972 | Yoshida et al. | 357/45 |
| 3,742,592 | 7/1973 | Rizzi et al. | 357/45 |
| 4,127,900 | 11/1978 | Raffel et al. | 357/51 |
| 4,257,832 | 3/1981 | Schwabe et al. | 357/41 |
| 4,322,822 | 3/1982 | McPherson | 357/23.4 |
| 4,488,262 | 12/1984 | Basire et al. | 357/45 |
| 4,494,135 | 1/1985 | Moussie | 357/51 |
| 4,499,557 | 2/1985 | Holmberg et al. | 357/45 |
| 4,507,673 | 3/1985 | Aoyama et al. | 357/51 |
| 4,507,756 | 3/1985 | McElroy | 357/41 |
| 4,507,757 | 3/1985 | McElroy | 357/41 |
| 4,543,594 | 9/1985 | Mohsen et al. | 357/86 |

FOREIGN PATENT DOCUMENTS

| | | | |
|---|---|---|---|
| 58-28750 | 6/1983 | Japan | 357/23.6 |
| 6074669 | 4/1985 | Japan | 357/23.6 |

*Primary Examiner*—William D. Larkins
*Assistant Examiner*—Jerome Jackson, Jr.
*Attorney, Agent, or Firm*—Lyon & Lyon

[57] ABSTRACT

Electrically-programmable low-impedance anti-fuses are disclosed having capacitor-like structure with very low leakage before programming and a low resistance after programming. The electrically-programmable low-impedance anti-fuses of the present invention include a first conductive electrode which may be formed as a diffusion region in a semiconductor substrate or may be formed from a semiconductor material, such as polysilicon, located above and insulated from the substrate. A dielectric layer, which, in a preferred embodiment includes a first layer of silicon dioxide, a second layer of silicon nitride and a third layer of silicon dioxide, is disposed over the first electrode. A second electrode is formed over the dielectric layer from a semiconductor material such as polysilicon, or a metal having a barrier metal underneath. At least one of the two electrodes of each anti-fuse is highly-doped or implanted with arsenic such that high concentrations of arsenic exist at the interface between the electrode and the dielectric layer. This arsenic will combine with other material and flow into the anti-fuse filament after programmed to form a low resistance controllable anti-fuse link. Circuitry is provided which allows the anti-fuse of the present invention to be programmed by application of a suitable programming voltage to input-output pins of the integrated circuit containing the anti-fuse. Where more than one anti-fuse is to be programmed using the programming voltage applied at the input-output terminals, other additional input-output terminals may serve as address inputs to specify the anti-fuse to be programmed.

In another embodiment of the present invention a programmable read-only memory array comprised of memory cells including an anti-fuse in combination with a single transistor. X-address and Y-address decoder circuits are provided to both program and read the contents of any selected memory cell in the array.

38 Claims, 4 Drawing Sheets

ELECTRICALLY-PROGRAMMABLE LOW-IMPEDANCE ANTI-FUSE ELEMENT

This application is a continuation-in-part of co-pending application Ser. No.861,519, filed May 9, 1986, now U.S. Pat. No. 4,823,181.

BACKGROUND

1. Field of the Invention

The present invention relates to the field of integrated electronic circuit technology. More particularly, the invention relates to a reliable and manufacturable capacitor-like, electrically-programmable interconnect device to be used in integrated circuits.

2. The Prior Art

Integrated electronic circuits are usually made with all internal connections set during the manufacturing process. However, because of high development costs, long lead times, and high manufacturing tooling costs of such circuits, users often desire circuits which can be configured or programmed in the field. Such circuits are called programmable circuits and they usually contain programmable links. Programmable links are electrical interconnects which are either broken or created at selected electronic nodes by the user after the integrated device has been fabricated and packaged in order to activate or deactivate respectfully the selected electronic nodes.

Programmable links have been used extensively in programmable read only memory devices (PROMs). Probably the most common form of programmable link is a fusible link. When a user receives a PROM device from a manufacturer, it usually consists of an X-Y matrix or lattice of conductors or semiconductors. At each cross-over point of the lattice a conducting link, called a fusible link, connects a transistor or other electronic node to this lattice network. The PROM is programmed by blowing the fusible links to selected nodes and creating an open circuit. The combination of blown and unblown links represents a digital bit pattern of ones and zeros signifying data which the user wishes to store in the PROM.

Such fusible link PROM systems present certain disadvantages. For instance, because of the nature of the conducting material in the link, relatively high voltage and high current levels are needed during programming to guarantee the complete blowing of the fusible links. Since the link is usually conductive, it needs large amounts of power dissipation to blow it. Also, the shape and size of the fusible link must be precise so that the link will function effectively as a conductor if it is not blown and will be a completely open circuit if it is blown. Therefore, very critical photolithographic steps and controlled etch techniques ar required during the manufacturing process of fusible link PROMs. Finally, a large gap must be blown in the link in order to prevent it from later becoming closed through the accumulation of the conducting material near the blown gap. Fusible link memory cells are relatively large in order to accommodate the link and its associated selection transistor and, therefore, fusible link PROM systems have high manufacturing and material costs and take up large amounts of chip real estate space.

In recent years, a second type of programmable links, called anti-fuse links, have been developed for use in integrated circuit applications. Instead of the programming mechanism causing an open circuit as is the case with fusible links, the programming mechanism in anti-fuse circuits creates a short circuit o relatively low resistance link. Anti-fuse links consist of two conductor and/or semiconductor materials having some kind of a dielectric or insulating material between them. During programming, the dielectric at selected points in between the conductive materials is broken down by predetermined applied voltages, thereby electrically connecting the conducting or semiconducting materials together.

Various materials have been suggested for the both the conducting layers and the dielectric or insulating layer. Some of the suggested dielectric materials require a relatively high current and voltage during programming, require complex manufacturing techniques and have low reliability during programming because it is difficult to control the reproducibility of the conductive state due to the nature of the crystalline structures of the materials involved. In addition, the programming process results in a link having a finite resistance in the order of several hundred to several thousand ohms. This characteristic of the known anti-fuse elements renders them relatively unsuitable for use in high speed circuits.

Some of the proposed dielectric insulators are doped amorphous silicon alloys, polycrystalline resistors, oxides, titanates of transition metals, oxides of silicon, aluminum oxide and cadmium sulfide. The problems with approaches utilizing these materials, have been related to the need of a high current and voltage to program or the difficulty to repeatably manufacture and control their reliability in both the on and off states. Materials such as cadmium sulfide, aluminum oxide and titanate present complicated technological problems because they are difficult to integrate into standard semiconductor processing.

Examples of known anti-fuse elements are found in the prior art using various insulating materials. Reference is made to: U.S. Pat. No. 3,423,646 which uses aluminum oxide, cadmium sulfide; U.S. Pat. No. 3,634,929 which uses single film of $Al_2O_3$, $SiO_2$, and $Si_3N_4$; U.S. Pat. No. 4,322,822 which uses $SiO_2$; U.S. Pat. No. 4,488,262 which uses oxide or titanate of a transition metal; U.S. Pat. No. 4,499,557 which uses doped amorphous silicon alloy; U.S. Pat. No. 4,502,208 which uses $SiO_2$; U.S. Pat. No. 4,507,757 which uses $SiO_2$; U.S. Pat. No. 4,543,594 which uses $SiO_2$.

Most of the above patents either describe complicated technologies or need high breakdown voltages and currents, and or are difficult to manufacture or do not meet the reliability requirements of state-of-the-art integrated circuits in both the on and off states. The prior art does not disclose the creation of controllable-radius conductive filaments with low resistance after programming or the need of specific electrode material or composition which would flow into the dielectric and create the required filament.

Other problems associated with existing anti-fuse links include large memory cells, and complex manufacturing processes for the unblown anti-fuse elements.

OBJECTS AND ADVANTAGES

An object of the present invention is to provide an electrically-programmable low-impedance interconnect element.

Another object of the present invention is to provide an electrically-programmable interconnect element which may be programmed with sufficiently low voltages and currents compatible with state-of-the-art semiconductor technology, resulting in a low impedance in the on-state.

Another object of the present invention is to provide an electrically-programmable interconnect element which is manufacturable using standard semiconductor processing and has high reliability in both the on and off states.

Yet another object of the present invention is t provide a reliable, electrically-programmable interconnect element, a plurality of which may be disposed in a integrated circuit for making selectable low-impedance interconnections.

Advantages associated with the present invention in some or all of its embodiments include an interconnect which can be made with standard semiconductor manufacturing techniques, having a small size, a high reading current after programming, may be fabricated using manufacturing process with a minimal number of steps, and having a controlled radius interconnect filament through the dielectric after programming resulting in a repeatably manufacturable controlled low resistance link after programming. Furthermore, the present invention is characterized by high reliability in both the programmed and unprogrammed state. Other and further advantages of the present invention will appear hereinafter.

SUMMARY OF THE INVENTION

An electrically-programmable anti-fuse, having a low impedance after programming, is disclosed. It consists of a capacitor-like structure having a first electrode and a second electrode with a dielectric layer disposed therebetween, characterized by a high impedance and very low leakage current before programming and a low-resistance after programming. A plurality of such anti-fuses may be disposed in a semiconductor integrated circuit, and may be selectively blown to create low-impedance interconnects at selected locations within the integrated circuit. The anti-fuses may be blown either before or after packaging of the integrated circuit die.

In accordance with the present invention, it is contemplated that a plurality of such anti-fuses is disposed in an integrated circuit, having means, such as contacts, polysilicon and metal lines, or combinations of the foregoing, for applying a programming voltage between the two electrodes of selected anti-fuses, from a signal originating at input/output (I/O) pads of the completed integrated circuit, for the purpose of creating a controlled-radius conductive filament through the dielectric layer and for connecting the anti-fuse of other circuitry.

The low impedance anti-fuse element of the present invention includes a dielectric between two conductive electrodes formed of an arsenic-containing material which will form the filament, such as arsenic-doped silicon or polysilicon. In a preferred embodiment, the first electrode may be made of a high electromigration immunity material and may be formed from either a diffusion region, heavily doped with arsenic, to provide for material which will form the filament, in a semiconductor substrate, polysilicon heavily doped with arsenic to provide the material which will form the filament, or single crystal silicon heavily doped with arsenic to provide the material which will form the filament.

The polysilicon may have a metal layer adjacent to it, on the side opposite to the side interfacing with the dielectric layer. Those of ordinary skill in the art will recognize that the metal may be any substance used to provide interconnect in integrated circuits or is used as a diffusion barrier. In addition, it is believed that combinations of the above materials will function in the present invention.

The second electrode may be formed of a conductor material such as a polysilicon layer heavily doped with arsenic to provide an arsenic-containing material which will be the material which will form the filament, an aluminum layer or an aluminum alloy layer. In other embodiments, lower electromigration immunity materials may be used as long as the current passed through the low impedance anti-fuse after programming is appropriately limited to assure proper lifetime.

In a preferred embodiment wherein the two electrodes are silicon or polysilicon layers heavily doped with arsenic, the concentration of the arsenic dopant should be highest at the interfaces between each of the electrode and the dielectric layer, since this will provide a large concentration of arsenic atoms which will flow to form the arsenic-containing filament.

The dielectric layer between the two electrodes may be either a singe layer or a composite, and is such that when it is disrupted by a high electric field, it will facilitate the flow of arsenic material comprising one or both of the two electrodes to produce a controlled-radius conductive filament during its breakdown. A "controlled-radius" filament refers to the fact that approximately the same radius may be repeatably achieved from instance to instance if the same programming parameters are employed on substantially identical structures. Such a dielectric requires a low amount of charge fluence to breakdown at the higher programming voltage with practically-used voltages and currents in integrated circuits. It also has a large enough charge fluence to breakdown at normal operating voltages to be a reliable circuit element during operation in its unprogrammed state.

After the formation of the filament, and during its formation, arsenic will flow from both electrodes and heavily dope the filament material with arsenic atoms. This will reduce the filament resistance and make its value more controllable.

During programming, as the applied voltage reaches the dielectric breakdown value, a localized weak spot in the dielectric starts to carry most of the leaking current and heats up, which, in turn, increases the leakage current. A thermal runaway condition develops which results in localized heating and melting of the dielectric and adjacent electrode material which includes arsenic. The arsenic-containing conductive material will flow from one of the two electrodes and form a conductive filament shorting both electrodes. The thickness of the electrodes should be sufficient not to cause any discontinuity or pits during the filament formation. The surface concentration and amount of arsenic should be sufficient to obtain the required low impedance filament. The final radius of the filament depend on the composition and thickness of the dielectric, the electrode conductive material melting temperature, the amount of arsenic in the electrodes, and the energy dissipated during programming.

Lower final resistance of this element after its programming can be obtained with a larger radius and a lower resistivity of the formed filament by addition of large quantities of arsenic atoms in the electrodes at the electrode-dielectric interface and a lower spreading resistance of both electrodes. A larger filament radius and higher electromigration immunity of the arsenic-containing conductive electrode material or composition which flows to form the filament result in higher current carrying capacity of the programmed element without the potential for creating a later open circuit due to electromigration. As the current which is applied across a filament increases, the larger the filament gets and the material which flows from both electrodes into the filament contains more arsenic thus lowering the anti-fuse resistance and preventing the electromigration of the filament.

In a preferred embodiment, one of the conductors, the top electrode, is formed of heavily doped polysilicon or is a sandwich of said polysilicon and a metal above it. The polysilicon layer should be heavily doped with arsenic, preferably to a concentration of between approximately $1 \times 10^{19}$ and $1 \times 10^{22}$ atoms/cm$^3$. Larger arsenic dopant concentrations result in lower filament resistances.

The other conductor, the lower electrode, is formed of heavily-doped diffusion region in a substrate or a well. This diffusion should be, preferably, heavily doped with arsenic to a concentration in the range of that of the top electrode. The arsenic doping profile should be such that the heaviest concentration of arsenic is present at the interfaces between the electrodes and the dielectric.

The dielectric in one presently-preferred embodiment is a three-layer sandwich formed of a bottom oxide layer of 20 A–50 A, a central silicon nitride (Si$_3$N$_4$) layer of 40 A–100 A, and a top oxide layer of 0 A to 50 A. In alternate preferred embodiments, the dielectric may be either a single layer of silicon dioxide, having a thickness of between approximately 60 and 150 angstroms, or a single layer of silicon nitride, Si$_3$N$_4$, having a thickness of between approximately 60 and 200 angstroms.

The low impedance anti-fuse element in the preferred embodiment is programmed by applying a current-controlled voltage source across the two electrodes. The composition of the composite dielectric is such that the structure provides an on-resistance of less than 300 ohms after programming and an off-resistance of more than 100 Mohms before programming. The structure requires a programming pulse of magnitude less than 30 volts, a time duration of less than 100 msec while supplying a current of less than 10 mA. The size of the conductive filament is a function of the voltage and current of the programming pulse and the composition of the composite dielectric structure. The resistance of the conductive filament is a function of the duration, voltage and current of the programming pulse and the amount of arsenic at the interfaces.

In a second and third embodiment of the low impedance anti-fuse element, the first and second electrodes may be formed from polysilicon lines doped with arsenic. This facilitates the interconnect between two conductors without using the silicon substrate as a path. Hence, the substrate can be used for active devices independent of the anti-fuses in the integrated circuit.

Those of ordinary skill in the art will recognize that the technology of this invention is compatible with and may be applied to any semiconductor structure or process to provide user-selectable interconnections.

BRIEF DESCRIPTION OF THE DRAWINGS

FIG. 5a is a circuit diagram showing an application of the electrically programmable low-impedance anti-fuse of the present invention as a read-only-memory.

FIG. 6 is a semiconductor profile drawing showing a cross-section of a memory cell from the array of FIG. 5a.

DETAILED DESCRIPTION OF THE PREFERRED EMBODIMENT

Figure 1:
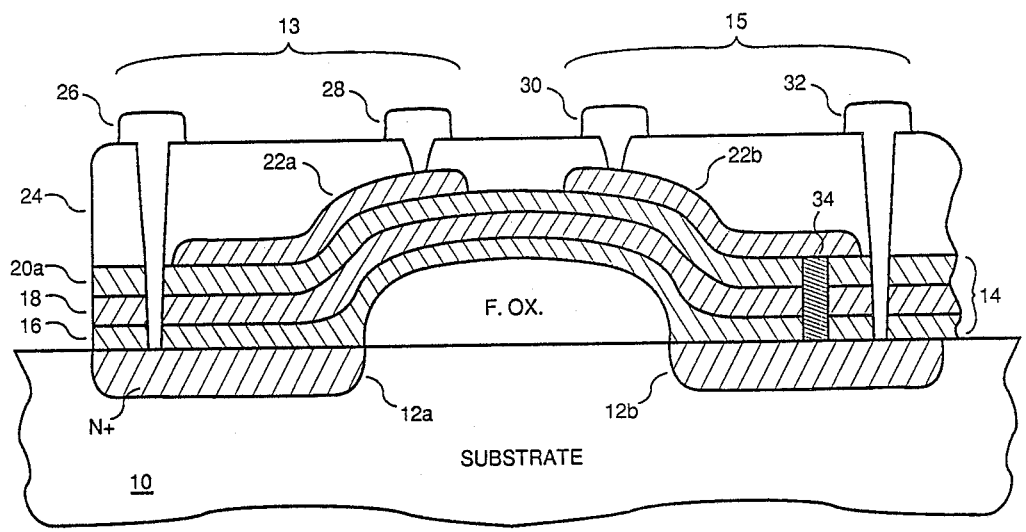
FIG. 1 is a cross-section of a first preferred embodiment of both a programmed and an unprogrammed low impedance anti-fuse element of the present invention, wherein the first electrode is a diffusion region in a semiconductor substrate material and the second electrode is a polysilicon layer.

Referring first to FIG. 1, a preferred embodiment of the present invention is fabricated on a semiconductor substrate 10. Those of ordinary skill in the art will readily recognize that substrate 10 may in fact be a well region of one conductivity type fabricated in a semiconductor substrate of opposite conductivity type as is common in a CMOS process or a heavily doped contact point having the same polarity as substrate 10. In the embodiment of FIG. 1, the first electrode 12a and 12b of unprogrammed anti-fuse 13 and programmed anti-fuse 15, respectively, are formed of a heavily-doped diffusion area in substrate 10. First electrodes 12a and 12b may, for example be ion-implanted to a concentration of from approximately $1 \times 10^{19}$ to $1 \times 10^{22}$ atom/cm$^3$ with arsenic at an energy of from approximately 30 to 120 KeV, preferably 50 KeV. Although ion implantation is presently preferred, those of ordinary skill in the art will realize that first electrodes 12a and 12b may be placed in substrate 10 by any of the known methods for creating such regions. Other diffusion regions may exist in the semiconductor substrate for the purposes of forming active devices and/or providing means by which a programming voltage can be supplied to the anti-fuse, as well as to connect it to other circuit elements.

Preferably, the doping profile of the arsenic dopant in first electrodes 12a and 12b will be such that the heaviest concentration will be at the upper surface of first electrodes 12a and 12b, the surface which will form the interface between first electrode 12 and the adjacent dielectric layer. Such a profile is sometimes referred to as "arsenic pileup" and may be achieved by known methods, such as those set forth in the article "The Diffusion of Ion-Implanted arsenic in Silicon," Richard B. Fair and Joseph C. C. Tsai, J. Electrochemical Society, Solid-State Science and Technology, December 1975, Vol. 122, No. 12, pp. 1689-1696, which is expressly incorporated herein by reference.

Next, a dielectric layer is formed over first electrodes 12a and 12b. In the embodiment illustrated in FIG. 1, the dielectric layer 14 is a composite layer comprising a first oxide layer 16 and a second silicon nitride layer 18. A third oxide layer 20 may also be employed. The dielectric layer 14 may also be formed of a single insulator material such as a layer of thermally-grown $SiO_2$, having a thickness of from approximately 50 to 150 angstroms, or $Si_3N_4$, having a thickness of from approximately 60 to 200 angstroms.

In the embodiment of FIG. 1, first oxide layer 16 is preferably thermally grown in a dry $O_2/N_2$ ambient at a temperature of between approximately 850° C. and 950° C. Second silicon nitride layer 18 is preferably formed using LPCVD nitride techniques at a temperature of between approximately 650° C. and 750° C. Third oxide layer 20 is preferably thermally grown $SiO_2$, in a dry $O_2$ ambient at a temperature of between approximately 850° C. and 950° C. Those of ordinary skill in the art, will, however, realize that other common semiconductor fabrication techniques may be employed to form the composite dielectric layer 14, as well as the single layer dielectrics of the alternate preferred embodiments.

In a presently-preferred embodiment, the thickness of the first oxide layer 16 of the dielectric 14 may be from approximately 20 to 50 angstroms. The thickness of the second silicon nitride layer may by from approximately 40 to 100 angstroms. The thickness of the third oxide layer 18 may be from approximately 0 to 50 angstroms. The relative thickness of these layers contribute to a reliable low impedance anti-fuse and facilitate the formation of controlled filament of desired radius and conductivity as will be disclosed further herein.

Second electrodes 22a and 22b preferably formed from a heavily doped polysilicon layer. The polysilicon layer may be formed in a conventional manner by LPCVD decomposition of silane and is doped with $POCl_3$ resulting in a sheet resistance of approximately 10 to 100 ohms/square to provide a low resistance of the electrode component of the total anti-fuse resistance after programming.

The polysilicon layer should also be heavily doped or implanted with arsenic to a concentration of from approximately $1 \times 10^{19}$ to $1 \times 10^{22}$ atoms/cm$^3$ and may be $5 \times 10^{21}$ atoms/cm$^3$ in a preferred embodiment at the interface of second electrodes 22a and 22b and dielectric layer 14. This doping profile may be achieved by an additional ion implant of arsenic in the polysilicon layer at an energy of from 30 to 100 KeV, preferably 70 Kev, depending on the thickness of second electrodes 22a and 22b followed by a thermal drive in step which may be performed at a temperature of between approximately 800° C. and 1100° C. for a period of from approximately 15 minutes to 3 hours preferably at 950° C. for 3 hours.

The thickness of the polysilicon may be from approximately 500 to 10,000 angstroms, and may be approximately 4500 angstroms in a preferred embodiment. Second electrodes 22a and 22b are defined by standard masking and etching steps from the polysilicon layer. Other portions of polysilicon layer 22 may be defined, if desired, to provide a means for applying a programming voltage to the anti-fuse, as well as to connect it to other circuit elements.

The second electrodes 22a and 22b may also include a conductive metal layer of aluminum approximately 5,000 to 15,000 angstroms on top of the polysilicon layer, formed using conventional processing steps.

After second electrodes 22a and 22b are formed for anti-fuses 13 and 15, an insulating layer 24 is placed over the surface of the wafer. Contact holes are then etched in insulating layer 24 and contacts 26, 28, 30, and 32 are formed. Contact 26 makes electrical contact with lower electrode 12a of anti-fuse 13, and contact 28 makes electrical contact with second electrode 22a of anti-fuse 13. Contact 30 makes electrical contact with second electrode 22b of anti-fuse 15 and contact 32 makes electrical contact with lower electrode 12b of anti-fuse 15.

Those of ordinary skill in the art will recognize that contacts 26, 28, 30 and 32 are usually formed at the same time as one of the metal interconnect layers of the integrated circuit. The portions of these contacts shown lying above insulating layer 24 in FIG. 1 represent cross-sections of such a metal interconnect layer. After patterning, portions of such a layer may be used to provide a means to supply a programming voltage to the anti-fuse, as well as to connect it to other circuit elements.

Anti-fuse 15 is shown programmed in FIG. 1a, and has a controlled-radius filament 34 formed in dielectric layer 14. Filament 34 is in electrical contact with first electrode 12b and second electrode 22b. Controlled-radius filament 34 is formed by applying a controlled-current programming voltage source between contact 30 and 32.

The low impedance anti-fuse element of the embodiment of FIG. 1 may be programmed by applying a current-controlled voltage source across the two electrodes via means which may include diffusion regions in the substrate, polysilicon lines, metal lines, combinations of the foregoing. The structure of the anti-fuse of this embodiment is such that an on-resistance of less than 300 ohms after programming and an off-resistance of more than 100 MOhms before programming is achieved.

A programming pulse of magnitude less than 30 volts is required for a time duration of less than 100 msec at a current of less than 10 mA. The size of the conductive filament is a function of the programming pulse and of the composition of the dielectric layer 14, and its effective radius is in the range of from 0.02 microns to 0.2 microns.

As an example, a low impedance anti-fuse element having an arsenic N-diffusion of $1 \times 10^{21}$ atoms/cm$^3$ lower electrode, a 4500 Angstrom polysilicon upper electrode heavily doped with $5 \times 10^{21}$ atoms/cm$^3$ of arsenic, having a sheet resistance of 18 ohms/square, and a dielectric consisting of a first layer of approximately 40 angstroms of Silicon dioxide ($SiO_2$), a second layer of approximately 70 angstroms of silicon nitride ($Si_3N_4$), and a third layer of approximately 15 angstroms of $SiO_2$ will produce a filament having an effective radius of approximately 0.05 microns if programmed with a pulse of approximately 18 v and a current of 1.0 mA for 100 msec of duration. It has been found that the resulting filament resistance is less than 40 ohms. For the same 18 V programming voltage and 100 msec of programming time a current of 0.2 mA and 10 mA will produce a filament with effective radius from 0.04 microns to 0.2 microns.

The results obtained in the foregoing example will be more easily understood by considering that the anti-fuse structure on a test chip used to obtain the results included a parasitic capacitance of approximately 10 pF. The discharging of this parasitic capacitance contributes to the current flow through the anti-fuse as the conductive filament begins to form, and those of ordinary skill in the art will realize that the size of this parasitic capacitance will affect the programming parameters.

Depending on the geometry of the application, an anti-fuse of the present invention may typically have a parasitic capacitance of anywhere from 0.1 to 5 pF. If the anti-fuse is assumed to have a parasitic capacitance of approximately 0.1 pF, then a programming voltage of 18 volts applied from a duration of 100 msec at a current of from 1.0 mA to 10 mA will produce radii of from approximately 0.004 microns to 0.02 microns. At a current of 10 mA, a radius of approximately 0.02 microns will be produced and a filament resistance of approximately 40 ohms will result. The total resistance of the programmed anti-fuse, including the spreading resistance of the electrodes, will be approximately 300 ohms.

Figure 2:
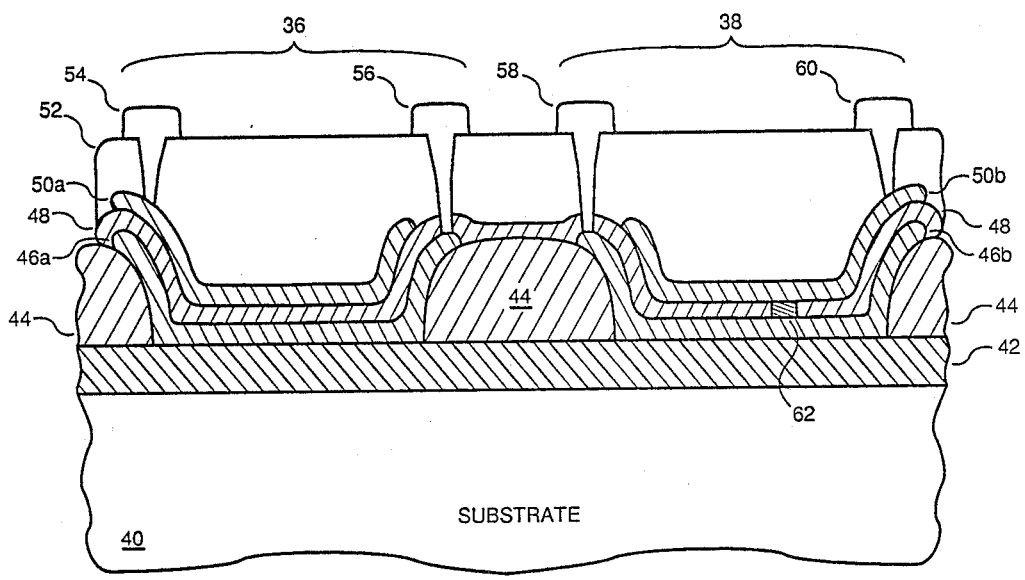
FIG. 2 is a cross-section of a second preferred embodiment of both a programmed and an unprogrammed low impedance anti-fuse element according to the present invention wherein both electrodes of each anti-fuse are polysilicon layers above and insulated from the substrate.
Figure 3:
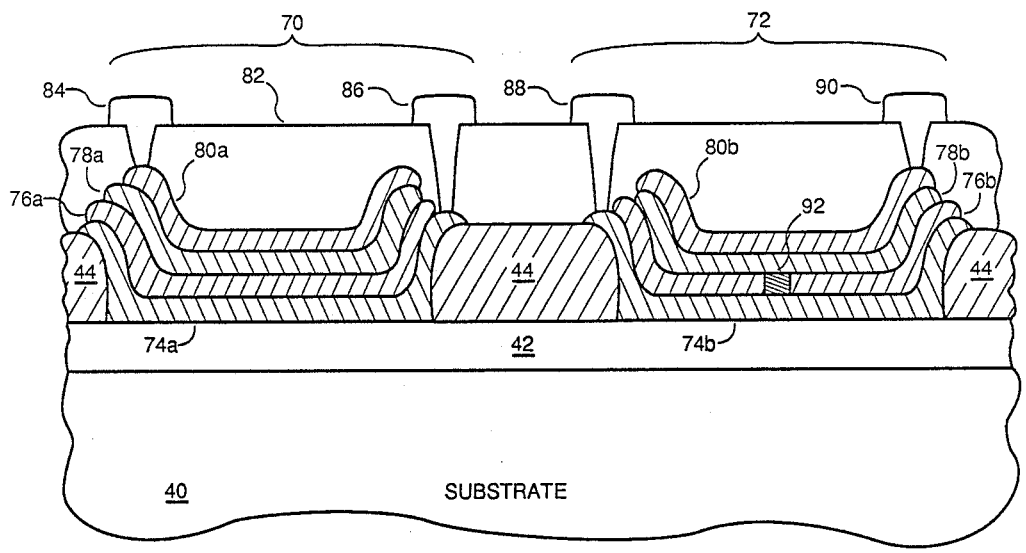
FIG. 3 is a cross-section of an alternative embodiment of both a programmed and an unprogrammed low impedance anti-fuse element according to the present invention, wherein the first electrode for each anti-fuse is a polysilicon electrode above and insulated from the substrate and the second electrode for each anti-fuse is a metal layer over a barrier metal layer covering the dielectric layer.

Referring now to FIGS. 2, and 3, other presently-preferred embodiments of the low impedance anti-fuse are disclosed wherein the two electrodes are above the substrate. These embodiments facilitate the interconnect between two conductors without using the silicon substrate as a path. Hence, in the embodiments of FIGS. 2 and 3, the substrate can be used for active devices which are electrically isolated from the anti-fuses.

Referring first to FIG. 2, both a programmed and an unprogrammed low impedance anti-fuse element 36 and 38 respectively to a presently-preferred embodiment of the present invention are depicted, fabricated on semiconductor substrate 40, which has been covered with a layer of insulating material 42, such as silicon dioxide. Insulating layer 42 serves to isolate the anti-fuses from the substrate.

After insulating layer 42 has been placed on the surface of semiconductor substrate 40, preferably by thermal oxidation of the substrate material, as is well-known in the art, the regions in which the anti-fuses are to be placed are defined. Field oxide regions 44 are grown using well-known techniques. Field oxide regions 44 serve to isolate each anti-fuse from other circuit elements on the integrated circuit.

A first polysilicon layer 46 is next formed over field oxide regions 44 and insulating layer 42 by the standard technique of LPCVD decomposition of silane at 950° C. to a thickness of from approximately 500 to 10,000 angstroms. Polysilicon layer 46 forms the first electrodes 46a and 46b for the unprogrammed and programmed anti-fuse elements 36 and 38, respectively.

Dielectric layer 48 is formed over first electrodes 46a and 46b after they have been defined by appropriate masking and etching steps well-known in the art. Dielectric layer 48 may be any of the single layer or composite dielectric structures disclosed with respect to the embodiment of FIG. 1.

A second polysilicon layer, having a thickness of between approximately 500 to 10,000 Angstrom, is next deposited over the surface of the wafer. Second electrodes 50a and 50b are formed for the unprogrammed and programmed anti-fuses 36 and 38, respectively, by conventional masking and etching steps. Those of ordinary skill in the art will readily recognize that first electrodes 46a and 46b and/or second electrodes 50a and 50b could be made from a single unbroken piece of polysilicon, i.e., the etching steps to separate them could be eliminated, if it is desired that they be electrically connected in common.

Next, an insulating layer 52 is formed over the surface of the wafer, and contact holes are etched using well-known conventional processing steps. Electrical contact is made to the unprogrammed anti-fuse in the usual manner by contacts 54 and 56 and to the programmed anti-fuse by contacts 58 and 60. Contacts 54, 56, 58, and 60, shown having portions above the surface of insulating layer 52 to represent the metal lines of which they are an integral part, comprise means to supply a programming voltage to anti-fuses. Those of ordinary skill in the art will readily comprehend the numerous available means available to make contact to electrodes 46a, 46b, 50a and 50b for the purpose of supplying programming voltage to anti-fuses 36 and 38 and to connect them to other circuit elements in the integrated circuit.

As with the embodiment disclosed with respect to FIG. 1, numerous means may be used to provide a programming voltage between the two electrodes and for connecting the anti-fuse to other circuit elements. These means include diffusion regions in the substrate connected to one or both of the electrodes by contacts, polysilicon lines, metal lines, or combinations of the foregoing and their equivalents.

Programmed anti-fuse 38 is shown after programming in FIG. 2 to include a controlled-radius conductive filament 62, which electrically connects first electrode 46b and second electrode 50b. This filament 62 has been created by applying a controlled-current voltage source between contacts 58 and 60, which causes dielectric layer 40 to rupture. As in the embodiment of FIG. 1, both the first and second anti-fuse electrodes are heavily doped with arsenic at the interface between the electrode and dielectric layer 48, resulting in a total anti-fuse resistance of less than 300 ohms.

Referring now to FIG. 3, a presently-preferred embodiment of the present invention is disclosed showing a programmed and an unprogrammed anti-fuse 70, and 72 respectively, constructed on semiconductor substrate 40 on which an insulating layer 42 has been formed. As in the embodiment of FIG. 2 field oxide regions 44 isolate anti-fuses 70 and 72 from each other and from other circuit elements on the integrated circuit. A first polysilicon layer is formed on the surface of the semiconductor wafer to a thickness of between 500 to 10,000 angstroms, preferably approximately 4,500 angstroms, and is defined by conventional masking and etching steps to form a lower electrodes 74a and 74b of anti-fuses 70 and 72 respectively. A dielectric layer is then formed over the surface of polysilicon layers 74a and 74b, and conventional masking and etching steps are used to define dielectric layers 76a and 76b. Barrier metal layer 78 is then formed over dielectric layers 76a and 76b, using conventional techniques. Barrier metal layer 78 may be formed from any of the metals conventionally used as barrier metal layers in semiconductor structures.

After the barrier metal has been formed on the surface of the semiconductor wafer, it is defined using conventional masking and etching steps to form 78a and 78b, associated with anti-fuses 70 and 72 respectively. A metal layer is then deposited over the surface of the semiconductor wafer. Suitable conventional masking and etching steps are used to define upper electrodes 80a and 80b of anti-fuses 70 and 72 respectively. An insulating layer 82 is then placed over the surface of the semiconductor wafer and contact holes are etched in it for the purpose of making contact to the structures below. Contacts are then formed on the surface of the insulating layer 82. Contact 84 forms an electrical connection to metal layers 78a the top electrode of anti-fuse 70. Contact 86 provides an electrical connection to polysilicon first electrode 74a of anti-fuse 70. Contact 88 forms an electrical connection to polysilicon first electrode 74b of anti-fuse 72, and contact 90 forms an electrical connection to metal top electrode 78b of anti-fuse 72.

As with the embodiments of FIGS. 1 and 2, means are provided for supplying programming voltage to the two electrodes, as well as for connecting the anti-fuse to other circuit elements.

Anti-fuse 72 is shown in FIG. 3 as programmed; controlled-radius filament 92 is shown connecting first electrode 74b and barrier metal layer 78b. Controlled-radius filament 92 is formed by applying a controlled-current programming voltage source between contacts 88 and 90.

One of the advantages of the low-impedance anti-fuse of the present invention is that it may be programmed after the integrated circuit in which it is incorporated has been packaged. Thus unlike certain other programming techniques such as laser programming, which require that the integrated circuit be in unpackaged state, programming of the anti-fuses of the present invention may be accomplished by the user after purchasing the circuit from a manufacturer.

Figure 4:
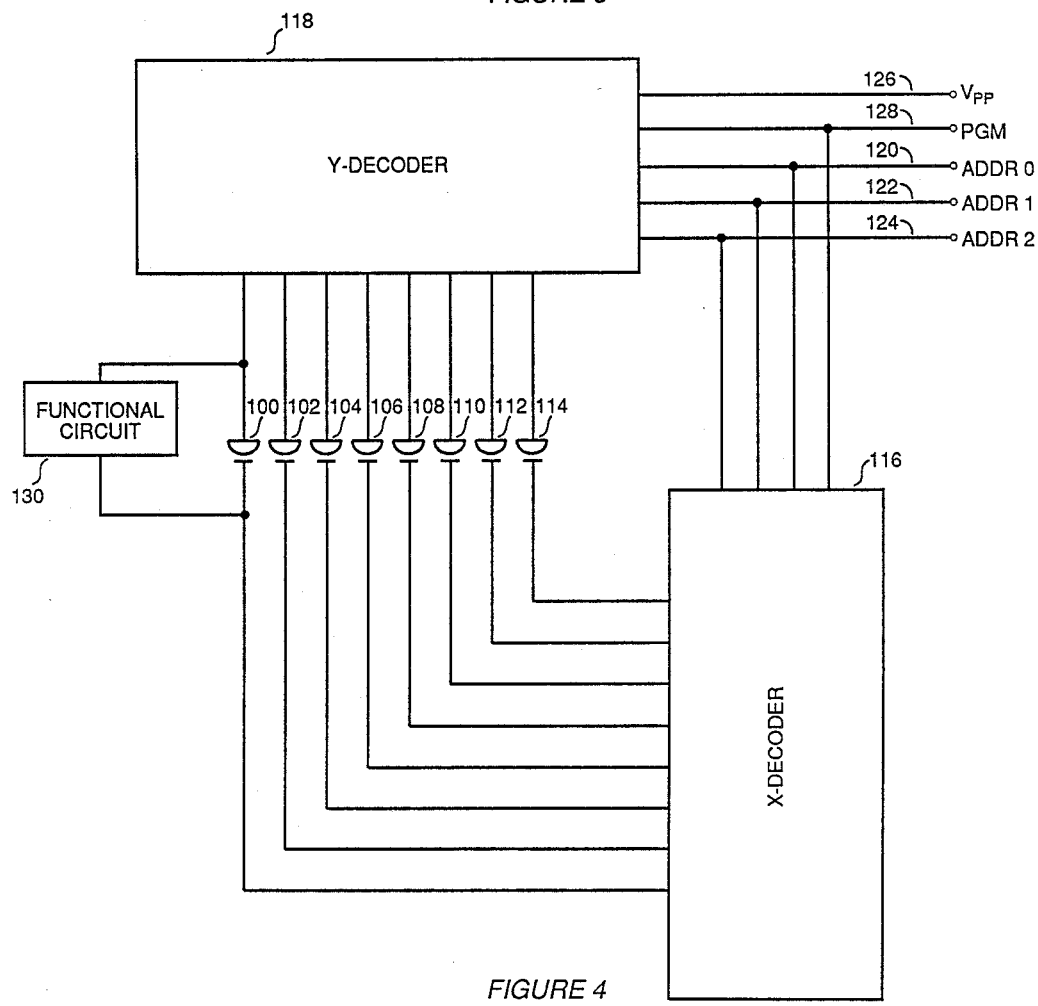
FIG. 4 is a schematic diagram illustrating how the electrically-programmable low-impedance anti-fuse of the present invention may be programmed using the external input/output pins of the integrated circuit in which it is contained.

Referring now to FIG. 4, apparatus for programming the electrically-programmable low-impedance anti-fuses of the present invention is disclosed. Those of ordinary skill in the art will readily understand that such circuitry may be disposed on the integrated chip along with functional circuitry with which the anti-fuse is to be associated.

FIG. 4 shows eight anti-fuses 100, 102, 104, 106, 108, 110, 112, and 114. Each of the anti-fuses is connected at one end to X decoder 116. The other end of each of the anti-fuses is connected to Y decoder 118. In the present example both X decoder 116 and Y decoder 118 may be a three line to eight line multiplexer. Both X decoder 116 and Y decoder 118 are driven by three address inputs 120, 122, and 124, which may be I/O pins on the integrated circuit.

Figure 6:
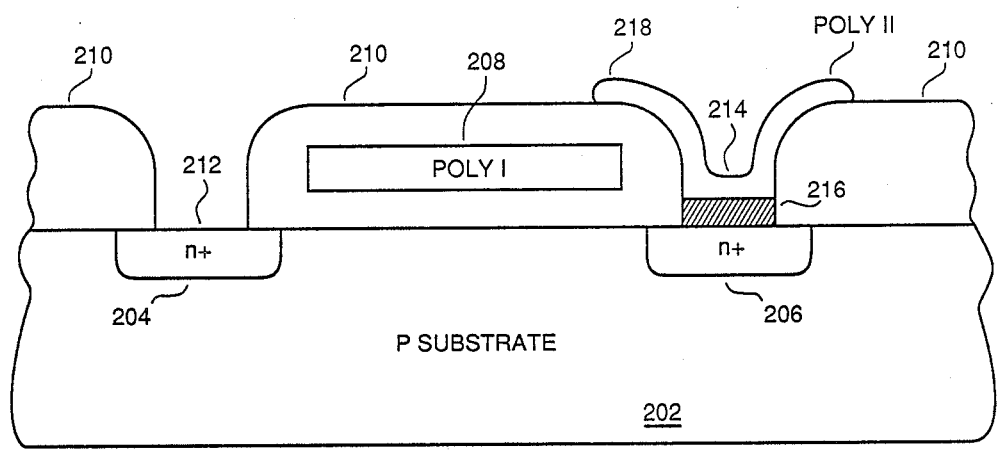

In addition to the address inputs to the X decoder 116 and Y decoder 118, a source of Vpp may be connected to either of the X or Y decoders via I/O pin 126. In FIG. 6, the Vpp I/O pin is shown connected to Y decoder 118. A program control line is connected to an I/O pin 128. The function of the program control line is to activate the X and Y decoders only when the programming function is desired to be implemented.

Those of ordinary skill in the art will readily recognize that X decoder 116 and Y decoder 118 function only during the time when selected ones of anti-fuses 100, 102 104, 106, 108, 10, 112, and 114 are programmed. At all other times the X decoder 116 and Y decoder 118 present an ideal infinite impedance and may be thought of as not connected to the anti-fuses.

During the times other than programming the anti-fuses are connected to functional circuits on the integrated chip in a manner dictated by the intended function of the anti-fuse. A functional circuit 130 is shown in block form having two of its nodes connected across anti-fuse 100. Although not shown, those of ordinary skill in the art will readily recognize that other functional circuits like 130 are connected across the other anti-fuses on the integrated circuit.

In order to program the anti-fuses of the present invention, an appropriate signal is placed on I/O pin 128 to indicate that programming is desired. This activates the X decoder and Y decoders in a manner such that when the desired address combination is placed on I/O pins 120, 122, and 124 and a programming voltage pulse Vpp is applied to Vpp input 126, the selected anti-fuse is programmed. In the present example, Vpp input I/O pin 126 is shown connected to the Y decoder. In this embodiment, when a anti-fuse is desired to be programmed Vpp appears on the selected output line of the Y decoder and the selected line of the X decoder corresponding to the same anti-fuse is driven to ground, thus placing the programming voltage Vpp directly across the anti-fuse desired to be programmed. Those of ordinary skill in the art will readily recognize that because at this time a high voltage is placed across the anti-fuse the circuitry in functional circuitry 130 must be protected from the high voltage, either by being fabricated from high voltage devices, or by being isolated by isolation devices which would also be driven from the program signal appearing on I/O pin 128.

The electrically-programmable low-impedance anti-fuse of the present invention may be used in numerous integrated circuit applications, in addition to its application as a programmable interconnect element in an integrated circuit. The electrically-programmable low-impedance anti-fuse of the present invention may be used to form a memory cell for a user programmable read-only-memory (PROM). A PROM array constructed of memory cells utilizing the present invention has distinct advantages over conventional floating gate EPROMS. These advantages include a read-current after programming which is higher than an EPROM for a cell of equal area. Furthermore, an PROM cell according to the present invention has no sensitivity to radiation, and forms a permanent hard connection to store the data, i.e., the information stored therein cannot leak away like information stored on a floating gate device.

The memory cell of the present invention is a fast device and may have an access time of as little as 35 nano seconds.

Referring first to FIG. 5a, a 4×4 array of memory cells configured according to the present invention is shown. A memory cell exists at each intersection of one of bit lines 150, 152, 154, and 156, with one of word lines 158, 160, 162, and 164. Each memory cell consists of an N-channel transistor 166a-p and an electrically-programmable low-impedance anti-fuse 168a -p connected in series. For example, in FIG. 5a one end of anti-fuse 168a is connected to bit line 150. The other end of anti-fuse 168a is connected to the drain of N-channel transistor 166a. The source of N-channel transistor 166a is connected to ground. The gate of N-channel transistor 166a is connected to word line 158. N-channel transistors 166b -p and anti-fuses 168b-p are connected to the other word lines and bit lines in a similar manner, as illustrated in FIG. 5a.

To sense the condition of any memory cell in the array of FIG. 5a, the word line to which that memory cell is connected is raised to a voltage sufficient to turn on the gate of the N-channel transistor to which it is connected. The voltage on the bit line to which the cell is connected is then sensed. If the anti-fuse has been programmed, the corresponding bit line will be pulled to ground when the corresponding word line is activated.

For example, assume anti-fuse 168 has been programmed, and is thus a short circuit. When word line 158 is brought high, N-channel transistor 166a will turn on and pull bit line 150 to ground.

The bit lines and word lines are accessed via X-address decoder 170 and Y-address decoder 172. X-address decoder has X-address inputs 174 and 176 and output 178. Which may be I/O pins on the semiconductor package containing the array. Y-address decoder has inputs 180 and 182, which may be I/O pins on the semiconductor package containing the array. By applying a unique two-bit address to Y-address inputs 180 and 182, one of word lines 158, 160, 162, or 164 is activated and has a high voltage on it. As will be appreciated by those of ordinary skill in the art, Y-address decoder 172 may be a conventional multiplexer or other addressing means known in the art.

When one of word lines 158, 160, 162, or 164 have been activated, a unique combination of data on X-address inputs 174 and 176, will connect either bit line 150, 152, 154, or 156 to output 178. As those of ordinary skill in the ar will appreciate, X-address decoder 170 may be a conventional N-line to one line demultiplexer or other functionally equivalent decoder known in the art.

To program any one of the memory cells in the array of FIG. 5a, the word line associated with that memory cell is brought to the programming voltage Vpp, which is applied to the Y-address decoder 172 via an I/O pin 184. The programming voltage Vpp is also placed on the bit line associated with that memory cell via I/O pin 184 through X-decoder 170. The Vpp voltage on I/O pin 184 will only be applied through the X and Y decoders if the signal on PGM I/O pin 186 is active. Those of ordinary skill in the art will recognize that X-decoder 170 and Y-decoder 172 should be configured from devices capable of handling the Vpp voltage. As a example of programming the array, if the programming voltage Vpp is placed on bit line 150 and word line 158, N-channel device 166a will turn on thus programming anti-fuse 168a.

Figure 5B:
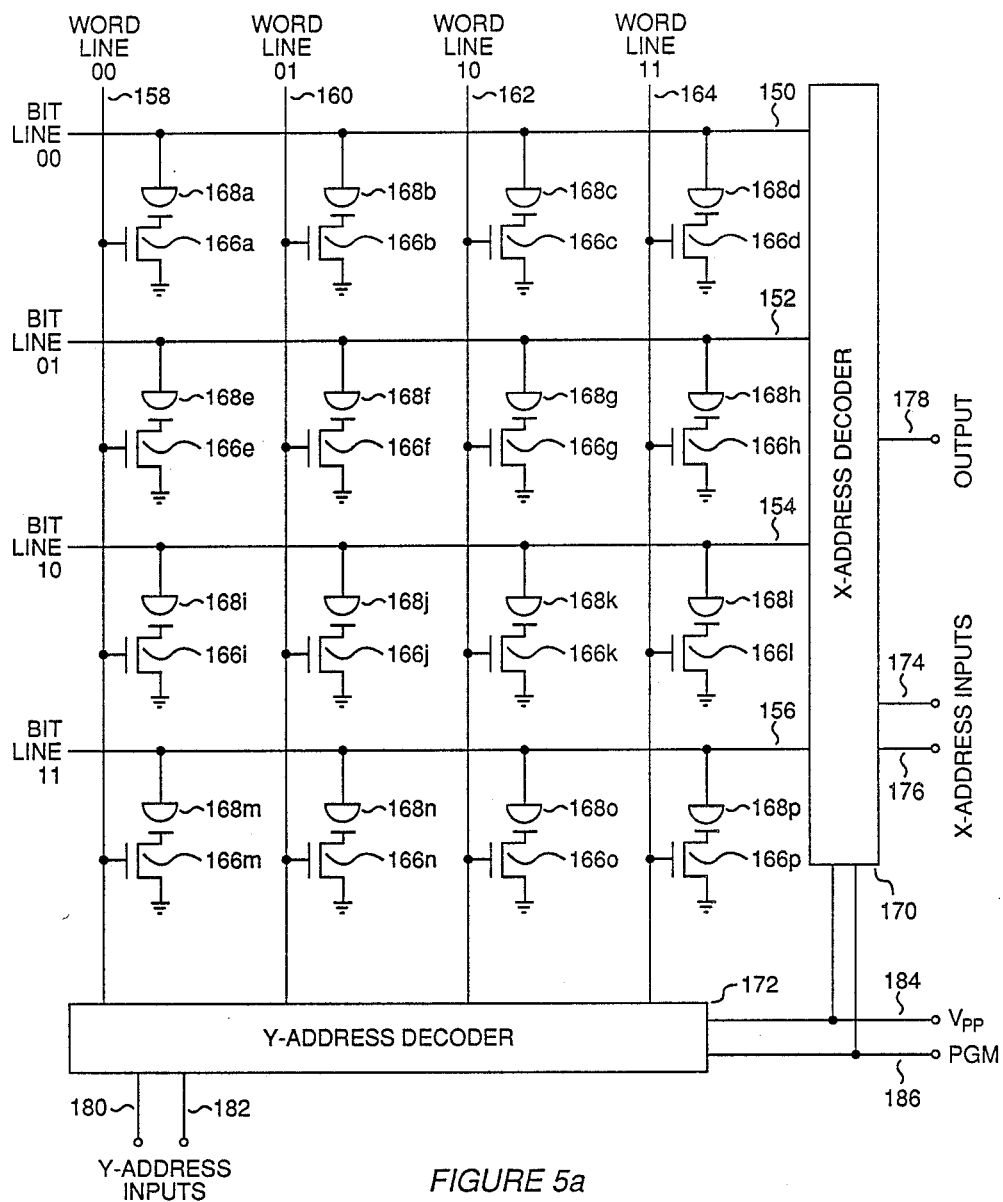
FIG. 5b is a schematic showing a first alternate embodiment for a cell of a read-only-memory constructed using the electrically-programmable low-impedance anti-fuse of the present invention.
Figure 5B:
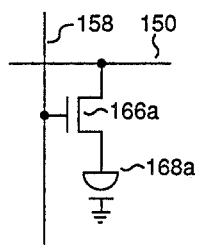

As those of ordinary skill in the art will appreciate from FIG. 5a, other cell configurations are possible. FIG. 5b illustrates an embodiment where the drain of N-channel transistor 166a is connected to bit line 150, its gate is connected to word line 158 and its source is connected to one end of anti-fuse 168a. The other end of anti-fuse 168a is connected to ground.

Figure 5C:
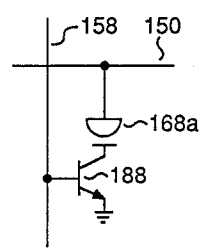
FIG. 5c is a second alternate embodiment of a cell of a read-only-memory constructed using the electrically-programmable low-impedance anti-fuse of the present invention.

Referring now to FIG. 5c, an embodiment of a memory cell according to the present in invention utilizing an NPN transistor is disclosed. NPN transistor 188 is shown having its base connected to word line 158 its emitter connected to ground an its collector connected to one end of anti-fuse 168a. The other end of anti-fuse 168a is connected to bit line 150. Those of ordinary skill in the art will realize that a lateral or vertical transistor could be employed, and further that the circuit of FIG. 5c could easily be implemented as an emitter follower with the anti-fuse on the emitter end of NPN transistor 188. Those of ordinary skill in the art will also recognize that P-channel devices or PNP transistors could be utilized in the present invention.

Referring now to FIG. 6, a semiconductor profile drawing showing a cross-section of a memory cell of FIG. 5a according to the present invention is shown. From FIG. 6a it can be seen that the memory cell is small and compact, taking up the space of only a single transistor device.

The memory cell 200 is shown constructed on P-type semiconductor substrate 202 into which N+ diffusion regions 204 and 206 have been made. Diffusion region 204 serves as the source of the N-channel transistor 166 of FIG. 5a. The diffusion region 206 forms the drain region of N-channel transistor 166a, as well as one end of anti-fuse 168a.

First level polysilicon region 208 forms the gate of N-channel transistor 166a. Those of ordinary skill in the art will realize that polysilicon strip 208 may form the gates for transistors 166a, 166e, 166i, and 166m as well as word line 158 in the embodiment of FIG. 5a as is conventional in memory arrays.

Insulating regions 210 are present as is customary in MOS structures. Contact holes are made in insulating layer 210 at areas 212 and 214. A conductive contact placed in area 212 serves to connect source of the N-channel transistor to ground. In the contact hole at region 214, dielectric layer 216 for the electrically-programmable low-impedance anti-fuse is formed. Second level polysilicon layer 218 is formed over dielectric layer 216. Those of ordinary skill in the art will realize that polysilicon layer 218 may form the other end of anti-fuses 168a, 168b, 168c, 168d, and bit line 150.

Preferred embodiments of the present invention have been disclosed. In the foregoing description, various specific details are set forth such as thicknesses, concentrations and processing details in order to provide a thorough understanding of the presently-preferred embodiments. It will be obvious to one skilled in the art, however, that the present invention may be practiced without these specific details and that the scope of the present invention is to be limited only by the appended claims.

What is claimed is:

1. An electrically-programmable, low-impedance anti-fuse element, including:
   a p-type semiconductor substrate,
   a first electrode comprising a diffusion region in said substrate,
   a dielectric layer over said diffusion region, said dielectric layer including a first silicon dioxide portion and a second silicon nitride portion over said first silicon dioxide portion,
   a second electrode over said dielectric layer,
   wherein at least one of said first and said second electrodes is heavily doped or implanted with arsenic such that a high concentration of arsenic atoms exists at the interface between said dielectric layer and said electrode, and a controlled radius conductive filament in said dielectric layer electrically connecting said first and second electrodes.

2. The electrically-programmable, low-impedance anti-fuse element of claim 1, wherein the arsenic doping level is from $1 \times 10^{19}$ to $1 \times 10^{22}$ atoms/cm$^3$.

3. The electrically-programmable, low-impedance anti-fuse element of claim 1 wherein said second electrode includes a layer of polysilicon having a thickness of from 500 to 10,000 angstroms.

4. The electrically-programmable, low-impedance anti-fuse element of claim 3 wherein said layer of polysilicon is heavily doped with arsenic such that a high concentration of arsenic exists at the interface between said second electrode and said dielectric layer.

5. The electrically-programmable, low-impedance anti-fuse element of claim 4, wherein the arsenic doping level in said polysilicon is from $1 \times 10^{19}$ to $1 \times 10^{22}$ atoms/cm$^3$.

6. The electrically-programmable, low-impedance anti-fuse element of claim 1, wherein said first silicon dioxide portion has a thickness of from 20 to 50 angstroms, and said second silicon nitride portion has a thickness of from 40 to 100 angstroms.

7. The electrically-programmable, low-impedance anti-fuse element of claim 1 wherein said dielectric layer further includes a third silicon dioxide portion over said second silicon nitride portion.

8. The electrically-programmable low-impedance anti-fuse element of claim 6, wherein said dielectric layer further includes a third silicon dioxide portion over said second silicon nitride portion having a thickness of from 0 to 50 angstroms.

9. An electrically-programmable, low-impedance anti-fuse element, including:
a p-type semiconductor substrate,
a first electrode comprising a diffusion region in said substrate, said region heavily doped with arsenic such that a high concentration of arsenic exists at the surface of said region,
a dielectric layer over said diffusion region, said dielectric layer including a first silicon dioxide portion and a second silicon nitride portion over said first silicon dioxide portion, and
a second electrode over said dielectric layer, and a controlled radius conductive filament in said dielectric layer electrically connecting said first and second electrodes.

10. The electrically-programmable low-impedance anti-fuse element of claim 9, wherein the arsenic doping level of said diffusion region is from $1 \times 10^{19}$ to $1 \times 10^{22}$ atoms/cm$^3$.

11. The electrically-programmable low-impedance anti-fuse element of claim 9 wherein said second electrode includes a layer of polysilicon having a thickness of from 500 to 10,000 angstroms and is doped with arsenic to a level of from $1 \times 10^{19}$ to $1 \times 10^{22}$ atoms/cm$^3$ such that a high concentration of arsenic exists at the interface between said second electrode and said dielectric layer.

12. The electrically-programmable low-impedance anti-fuse element of claim 9 wherein said first silicon dioxide portion has a thickness of from 20 to 50 angstroms, and said second silicon nitride portion has a thickness of from 40 to 100 angstroms.

13. The electrically-programmable low-impedance anti-fuse element of claim 9 wherein said dielectric layer further includes a third silicon dioxide portion over said second silicon nitride portion.

14. The electrically-programmable, low-impedance anti-fuse element of claim 12, wherein said dielectric layer further includes a third silicon dioxide portion having a thickness of from 0 to 50 angstroms.

15. An electrically-programmable, low-impedance anti-fuse element, including:
a semiconductor substrate,
an insulating layer over said semiconductor substrate,
a first electrode formed from a conducting material, over said insulating layer,
a dielectric layer over said first electrode, said dielectric layer including a first silicon dioxide portion and a second silicon nitride portion over said first silicon dioxide portion, second electrode over said dielectric layer,
wherein at least one of said first and second electrodes is heavily doped with arsenic such that a high concentration of arsenic atoms exists at the interface of said dielectric layer and said heavily doped one of said first or second electrodes and a controlled radius conductive filament in said dielectric layer electrically connecting said first and second electrodes.

16. The electrically-programmable low-impedance anti-fuse element of claim 15 wherein at least one of said first and second electrodes includes a layer of polysilicon heavily doped with arsenic such that a high concentration of arsenic atoms exists at the interface between said dielectric layer and said electrode.

17. The electrically-programmable, low-impedance anti-fuse element of claim 16 wherein said layer of polysilicon has a thickness of from 500 to 10,000 angstrom and is doped with arsenic to a level of from $1 \times 10^{19}$ to $1 \times 10^{22}$ atoms/cm$^3$.

18. The electrically-programmable, low-impedance anti-fuse element of claim 15 wherein both of said first and second electrodes include a layer of polysilicon having a thickness of from 500 to 10,000 angstroms and doped with arsenic to a level of from $1 \times 10^{19}$ to $1 \times 10^{22}$ atoms/cm$^3$.

19. The electrically-programmable low-impedance anti-fuse element of claim 15 wherein said first silicon dioxide portion has a thickness of from 20 to 50 angstroms, and said second silicon nitride portion has a thickness of from 40 to 100 angstroms.

20. The electrically-programmable, low-impedance anti-fuse element of claim 15 wherein said dielectric layer further includes a third silicon dioxide portion over said second silicon nitride portion.

21. The electrically-programmable, low-impedance anti-fuse element of claim 19, wherein said dielectric layer further includes a third silicon dioxide portion over said second silicon nitride portion having a thickness of from 0 to 50 angstroms.

22. A semiconductor structure disposed in an integrated circuit, including:
a plurality of electrically-programmable low-impedance anti-fuses, each of said anti-fuses including a first electrode formed from a conducting material, a dielectric layer over said first electrode, said dielectric layer including a first silicon dioxide portion and a second silicon nitride portion over said first silicon dioxide portion, and a second electrode formed of a conductive material over said dielectric layer, wherein at least one of said first and second electrodes is heavily doped with arsenic such that a heavy concentration of arsenic atoms exists at the interface between said dielectric layer and said electrode,
at least one of said electrically-programmable low impedance anti-fuse element including a controlled-radius filament in said dielectric layer electrically connecting said first and second electrodes.

23. The semiconductor structure of claim 22, wherein at least one of said first and second electrodes includes a layer of polysilicon heavily doped with arsenic to a level of $1 \times 10^{19}$ to $1 \times 10^{22}$ atoms/cm$^3$ having a thickness of from 500 to 10,000 angstroms.

24. The semiconductor structure of claim 22, wherein said first silicon dioxide portion has a thickness of from 20 to 50 angstroms and said second silicon nitride portion has a thickness of from 40 to 100 angstroms.

25. The semiconductor structure of claim 22 further including a third silicon dioxide portion over said second silicon nitride portion in said dielectric layer.

26. The semiconductor structure of claim 24 further including a third silicon dioxide portion over said second silicon nitride portion in said dielectric layer, having a thickness from 0 to 50 angstroms.

27. The semiconductor structure of claim 22, wherein both of said first and said second electrodes of each of said plurality of electrically-programmable low-impedance anti-fuse elements include a layer of polysilicon heavily doped with arsenic such that a high concentration of arsenic atoms exists at the interface between said dielectric layer and each of said first and second electrodes.

28. The semiconductor structure of claim 27 wherein said first and second electrodes include a layer of polysilicon having a thickness of from 500 to 10,000 angstroms doped with arsenic to a level of from $1 \times 10^{19}$ to $1 \times 10^{22}$ atoms/cm$^3$.

29. The semiconductor structure of claim 22, wherein said controlled-radium filament has a resistance of less than 300 ohms.

30. A semiconductor structure disposed in an integrated circuit, including:
a plurality of electrically-programmable low-impedance anti-fuses, each of said anti-fuses including a first electrode comprising an n-type diffusion region in a p-type semiconductor substrate of said semiconductor structure, a dielectric layer over said first electrode, said dielectric layer including a first silicon dioxide portion and a second silicon nitride portion over said first silicon dioxide portion, and a second electrode formed of a conductive material over said dielectric layer, wherein at least one of said first and second electrodes is heavily doped with arsenic such that a heavy concentration of arsenic atoms exists at the interface between said dielectric layer and said electrode,
at least one of said electrically-programmable low impedance anti-fuse elements including a controlled-radius filament in said dielectric layer electrically connecting said first and second electrodes.

31. The semiconductor structure of claim 30, wherein said second electrode includes a layer of polysilicon having a thickness of from 500 to 10,000 angstroms.

32. The semiconductor structure of claim 30, wherein each of said n-type diffusion regions are doped with arsenic to a concentration of from between $1 \times 10^{19}$ to $1 \times 10^{22}$ atoms/cm$^3$.

33. The semiconductor structure of claim 32, wherein said second electrode includes a layer of polysilicon having a thickness of from 500 to 10,000 angstroms doped with arsenic to a concentration of from $1 \times 10^{19}$ to $1 \times 10^{22}$ atoms/cm$^3$.

34. The semiconductor structure of claim 30, wherein said first silicon dioxide portion has a thickness of from 20 to 50 angstroms and said second silicon nitride portion has a thickness of from 40 to 100 angstroms.

35. The semiconductor structure of claim 30, further including a third silicon dioxide portion over said second silicon nitride portion in said dielectric layer.

36. The semiconductor structure of claim 34, wherein said dielectric layer further includes a third silicon dioxide portion over said second silicon nitride portion, said third silicon dioxide portion having a thickness of from 0 to 50 angstroms.

37. The semiconductor of any one of claims 22, 23, 24, 26, 28, 29, 30–33, 34–36, further including:
means for applying a programming voltage to said first and second electrodes of selected ones of said anti-fuses from input/output pins of said integrated circuit.

38. A user-programmable read-only-memory array, including:
a plurality of bit lines,
a plurality of word lines, forming intersections with bit lines,
a plurality of memory cells, one of said memory cells located at each of said intersections, each of said memory cells including an electrically-programmable, low-impedance anti-fuse according to any of claims 1–5, 7, 10–11, 13–18, 20, 22–25, 27–29, each of said memory cells further including a transistor having a source, a drain, and a gate, one end of said anti-fuse connected to the one of said bit lines associated with said intersection, the other end of said anti-fuse connected to the drain of said transistor, the source of said transistor being connected to a fixed voltage potential, and the gate of said transistor being connected to the one of said word lines associated with said intersection,
a Y-address decoder having a plurality of Y-address inputs, and a set of outputs, each of said outputs corresponding to one of said word lines in said array, said Y-address decoder operating to activate only one of said word lines for unique combination of said data on said Y-address inputs,
an X-address decoder, having a plurality of X-address inputs, a set of outputs, and a data output, each one of said outputs connected to one of said bit lines, such that only one of said bit lines is connected to said data output when a unique combination of data appears on said X-address inputs,
means for applying a programming voltage to a selected one of said bit lines at a selected time, and,
means for applying said programming voltage to a selected one of said word lines at said selected time.

* * * * *

UNITED STATES PATENT AND TRADEMARK OFFICE
CERTIFICATE OF CORRECTION

PATENT NO. : 4,899,205

DATED : February 6, 1990

INVENTOR(S) : Esmat Z. Hamdy, Amr M. Mohsen, and John L. McCollum

It is certified that error appears in the above-identified patent and that said Letters Patent is hereby corrected as shown below: ON TITLE PAGE:

Insert the names of the following persons as inventors:

Shih-Ou Chen of Fremont, California; and
Steve S. Chiang of Saratoga, California Signed and Sealed this Fifteenth Day of September, 1992

*Attest:*

DOUGLAS B. COMER

*Attesting Officer*      *Acting Commissioner of Patents and Trademarks*